(12) United States Patent
Lutz et al.

(10) Patent No.: US 7,587,305 B2
(45) Date of Patent: Sep. 8, 2009

(54) TRANSISTOR LEVEL VERILOG

(75) Inventors: Robert J. Lutz, Chippewa Falls, WI (US); Mark S. Birrittella, Chippewa Falls, WI (US); Eric C. Fromm, Eau Claire, WI (US); Harro Zimmermann, Onalaska, WI (US)

(73) Assignee: Cray Inc., Seattle, WA (US)

( * ) Notice: Subject to any disclaimer, the term of this patent is extended or adjusted under 35 U.S.C. 154(b) by 467 days.

(21) Appl. No.: 10/180,265

(22) Filed: Jun. 26, 2002

(65) Prior Publication Data

US 2004/0002846 A1    Jan. 1, 2004

(51) Int. Cl.
    *G06F 17/50* (2006.01)
(52) U.S. Cl. .................................................. 703/15
(58) Field of Classification Search ................... 703/15
    See application file for complete search history.

(56) References Cited

U.S. PATENT DOCUMENTS

| 5,230,049 | A  | * | 7/1993  | Chang et al. ............... 717/143 |
| 5,481,484 | A  | * | 1/1996  | Ogawa et al. ................. 703/14 |
| 6,009,441 | A  | * | 12/1999 | Mathieu et al. ............. 715/516 |
| 6,792,579 | B2 | * | 9/2004  | Rankin .......................... 716/3 |
| 6,978,231 | B2 | * | 12/2005 | Williams et al. .............. 703/14 |
| 2001/0011371 | A1 | * | 8/2001 | Tang .............................. 717/9 |
| 2002/0049576 | A1 | * | 4/2002 | Meyer ......................... 703/14 |
| 2002/0049577 | A1 | * | 4/2002 | Scherr ......................... 703/14 |

OTHER PUBLICATIONS

Baghdadi, A., Zergainoh, N-E., Cesario, W., Roudier, T., Jerraya, A.A.; "Design Space Exploration for Hardware/Software Codesign of Multiprocessor Systems", Jun. 2000, 11th International Workshop on Rapid System Prototyping, Proceedings.*

Palnitkar, Samir; "Verilog HDL A Guide to Digital Design and Synthesis", 1996, Sunsoft Press.*

Shenggao Li et al.; "The Implementation of a VHDL-AMS to SPICE Converter", Sep. 1999, Analog Integrated Circuits and Signal Processing, vol. 20, No. 3, pp. 203-211.*

E.L. Acuna et al.; "iSPLICE3: A New Simulator for Mixed Analog/Digital Circuits", 1989, IEEE 1989 Custom Integrated Circuits Conference, pp. 13.1.1-13.1.4.*

Michael C Naum et al.; "Automatic functional model validation between Spice and Verilog", 1995, Conference Record of the 1995 IEEE Industry Applications Conference, pp. 1076-1083.*

A.S. Zebardast et al.; "SPV2: Accelerating post-layout Spice Simulation using Verilog Gate-Level Modeling", May 2001, 2001 Canadian Conference on Electrical and Computer Engineering, pp. 253-257.*

(Continued)

*Primary Examiner*—Paul L Rodriguez
*Assistant Examiner*—Russ Guill
(74) *Attorney, Agent, or Firm*—Schwegman, Lundberg & Woessner, P.A.

(57) ABSTRACT

A method includes specifying a first set of interconnected devices associated with a first leaf cell in Verilog syntax, and specifying a second set of interconnected devices associated with a second leaf cell in Verilog syntax. A connection between the first leaf cell and the second leaf cell is also specified in Verilog syntax. This specifies a circuit. The functionality of the logic can be tested by running a logic simulation on the circuit without converting to Verilog syntax. The Verilog syntax, associated with the circuit, can be converted directly from Verilog syntax to a SPICE netlist. The SPICE netlist can be used to simulate the timing and other parameters of the circuit. The Verilog syntax can be used to verify the circuit. Also included are a computer readable medium including an instruction set for the above method, and a data structure necessary to carry out the above method.

21 Claims, 5 Drawing Sheets

K. Kobayashi et al.; "ST:PERL package for simulation and test environment", May 2001, The 2001 IEEE International Symposium on Circuits and Systems, pp. V-89-V92.*

Samir Palnitkar, "Verilog HDL A Guide to Digital Design and Synthesis", 1996, SunSoft Press, pp. 175-176.*

Ernst Christen et al., "VHDL-AMS A Hardware Description Language for Analog and Mixed-Signal Applications", Oct. 1999, IEEE Transactions on Circuits and Systems II:Analog and Digital Signal Processing, vol. 46, No. 10, pp. 1263-1272.*

* cited by examiner

Example: 2 input NAND gate
```
==================> tlv section <==================
310 —— module st_nand2_a ( z, a, b );
312 —— output   z;
314 —— input    a,b;
316 —— wire     int_z;
318 —— assign   int_z    = 1'b0 & a     &  b
                         | 1'b1 & ~a    |  1'b1 & ~b;
320 —— //tlv abs int_z           5          5
         //                      5          5
322 —— assign   z    = int_z;
324 —— //tlv output  z    6 levels 0
         endmodule
==================> tlv section end <==================
```

Fig. 3

SPICE netlist

```
*** tlv2tls version 1.62 run on Thu Jan 10 16:15:18 2002 by lutz
.subckt st_nand2_a z a b
***
**pin z property output
**pin a property input
**pin b property input
***
***
m1 temp1 a GND GND nch l=0.225u w=4.995u
+ ad=2.01146p as=2.01146p pd=10.725u ps=10.725u
m2 z b temp1 GND nch l=0.225u w=4.995u
+ ad=2.01146p as=2.01146p pd=10.725u ps=10.725u
m3 z a VDD VDD pch l=0.225u w=4.995u
+ ad=2.01146p as=2.01146p pd=10.775u ps=10.775u
m4 z b VDD VDD pch l=0.225u w=4.995u
+ ad=2.01146p as=2.01146p pd=10.775u ps=10.775u
***
***
.ends
```

*Fig. 6*

TRANSISTOR LEVEL VERILOG

FIELD OF THE INVENTION

The present invention relates to an apparatus and method for describing transistors within the leaf cell and the interconnection between the transistors.

BACKGROUND OF THE INVENTION

Electronic components are becoming increasingly complex as more and more capability is being designed into the electronic components. Typically, the more complex an electrical component becomes, the greater number of semiconductor devices that need to be used to form the circuits that carry out the functions.

In the past, circuits are designed using a graphical tool to draw schematic diagrams of the circuits. Designers use a graphical program, such as Composer which is available from Cadence, Inc. of San Jose, Calif. Drawing the schematic is actually a graphical process in which the designer uses symbols to designate one of various types of transistors, such as for an NMOS or PMOS transistor. A number of transistors are designated with the transistor type, and then a wiring feature is used to connect terminals of all the designated devices together. The designer provides input ports and output ports and annotates the symbols to specify certain properties for a particular transistor. The properties specified include length and width of a gate of a transistor. Other size properties may also be designated. In short, past efforts for circuit design include a graphical way of trying to describe the particular components and the way the components are connected. Another trend is to design at least some portions of a circuit from certain building blocks (called leaf cells) which include a group of transistors. Rather than design a circuit totally from scratch, the circuit is designed by connecting these building blocks or leaf cells.

Before actually building the circuit, several tests are performed on the circuit as designed. The first test is a functional simulation. The functional simulation attempts to assure that the design of the circuit is correct. In other words, for a certain set of inputs, the circuit should produce a certain set of outputs in order for the circuit to be correctly carrying out a function. A first series of scripts or procedures are applied to the graphical data used to design the circuit. The series of scripts or procedures converts the graphical data to a hardware description language ("HDL"). One commonly used HDL is known as Verilog. Once the HDL is formed a simulation program, such as VCS Simulator available from Synopsis of Mountain View, Calif. is used to test the functionality of the circuit. Verilog is a HDL that is used to interconnect the blocks for the purpose of running a functional simulation test.

In addition, another simulation test is used to check other aspects of the circuit. A Simulation Program Integrated Circuits Especially! ("SPICE") test is also generally performed on a circuit. The SPICE test is used to provide a reasonably detailed analysis of circuits containing active components such as bipolar transistors, field effect transistors, diodes and lumped components such as resistors, capacitors and inductors. SPICE is a circuit simulation program rather than a logic simulation program. Thus SPICE considers the voltages and currents in a circuit to be continuous quantities, not quantized into high/low values. SPICE can be used for many purposes, one of which is to simulate the timing of signals passing through the circuit. SPICE is used to identify certain problems with the design before the actual design is fabricated. Identified problems can be rectified before actually manufacturing the circuit. A second series of scripts or procedures are applied to the graphical data to convert the SPICE format. The SPICE simulation is then run on the converted graphical data.

In short, current circuit design includes using a graphical tool to draw schematic diagrams of the circuits. The circuit designer uses symbols to designate one of various types of transistors, such as for an NMOS or PMOS transistor. The resulting graphical data and designations are then converted into Verilog for a first test. The graphical data and designations are also converted into SPICE format for use in the SPICE simulation.

This method of circuit design has several problems. Among the problems is that the conversion programs are not always perfect. For example, when the conversion program converts the graphical data and designations into a hardware description language, such as Verilog, problems can occur in the functional simulation of the logic. Generally, the functional simulation of the logic results in the logic checking out correctly when in fact there is a mistake in the logic. The same can happen in the SPICE simulation. In other words, the SPICE simulation can result in the circuit checking out correctly when in fact there may be a flaw that needs to be corrected. Yet another problem is that some designers prefer not to design a circuit using graphical data and designations.

Therefore, there is a need for syntax which will avoid the necessity of converting from graphical data and designations of the transistors to a hardware description language, such as Verilog. There is still a further need to allow the design of circuits without using graphical data and designations of on the transistors.

SUMMARY OF THE INVENTION

Method includes specifying a first set of interconnected devices associated with a first leaf cell in Verilog syntax, and specifying a second set of interconnected devices associated with a second leaf cell in Verilog syntax. A connection between the first leaf cell and the second leaf cell is also specified in Verilog syntax. This specifies a circuit. The functionality of the logic can be tested by running a logic simulation on the circuit without converting to Verilog syntax. The Verilog syntax, associated with the circuit, can be converted directly from Verilog syntax to a SPICE netlist. The SPICE netlist can be used to simulate the timing and other parameters of the circuit. The Verilog syntax can be used to verify that the circuit as built. Specifying the first set of interconnected devices associated with the first leaf cell further includes specifying parameters needed for the SPICE netlist as a comment in the Verilog syntax. In addition, specifying the second set of interconnected devices associated with the second leaf cell also includes specifying parameters needed for the SPICE netlist as a comment in the Verilog syntax.

A computer readable medium includes an instruction set for causing a suitably programmed computer system to execute the method set forth in the previous paragraph. In addition, a data structure includes a first portion which controls portion of the Verilog simulation and is ignored by the SPICE simulation, and includes a second portion which controls the SPICE, simulation and is ignored by the Verilog simulation.

A method includes inputting a plurality of commands having a syntax language wherein each command includes a first specification and a second specification. The method also includes executing a logic simulation controlled by the first specification and ignoring the second specification in the logic simulation. The method also includes executing a timing simulation controlled by the second specification and ignoring the first specification in the timing simulation. In some embodiments, executing a logic simulation controlled by a first simulation and ignoring the second specification includes designating the second specification as a comment field to the logic simulation. Executing a timing simulation controlled by the second specification and ignoring the second specification includes designating the first specification as a comment field to the timing simulation. Executing the logic simulation further comprises executing a file using a hardware description language. In some embodiments, the hardware description language for executing the logic simulation is Verilog. In some embodiments, the timing simulation is executed using a file in SPICE format. In some embodiments, executing the timing simulation includes converting a file in Verilog to a file in SPICE format. More generally, executing the timing simulation further includes converting the logic simulation file format to a timing simulation file format.

An article of manufacture includes a computer readable media having instructions thereon. The instructions cause a suitably programmed system to execute a method that includes inputting a plurality of commands having a syntax language wherein each command includes a first specification and a second specification. The method also includes executing a logic simulation controlled by the first specification and ignoring the second specification in the logic simulation. The method also includes executing a timing simulation controlled by the second specification and ignoring the first specification in the timing simulation.

A data structure includes a plurality of command records each following a language syntax wherein each one of the plurality of command records includes a first specification and a second specification. The first specification provides information to be executed by a logic simulator and ignored by a timing simulator. The second specification provides information to be executed by a timing simulator and ignored by a logic simulator.

An article of manufacture includes a computer readable media having a data structure for causing a suitably programmed system to execute a logic simulation that is controlled by the first specification and a timing simulation that is controlled by the second specification. The data structure of the article of manufacture includes a plurality of command records each following a language syntax wherein each one of the plurality of command records includes a first specification and a second specification. The first specification provides information to be executed by a logic simulator and ignored by a timing simulator. The second specification provides information to be executed by a timing simulator and ignored by a logic simulator. In some embodiments, the article of manufacture the data structure causes a suitably programmed system to execute a Verilog simulation that is controlled by the first specification and a SPICE simulation that is controlled by the second specification.

A simulation system includes storage that holds a plurality of commands having a syntax language wherein each command includes a first specification and a second specification. The simulation system also includes a logic simulator that is controlled by the first specification and that ignores the second specification. The simulation system also includes a timing simulator that is controlled by the second specification and that ignores the first specification. In some embodiments of the simulation system, the plurality of commands are written in Verilog. In some embodiments, the timing simulation includes a set of instructions for converting Verilog directly into a SPICE netlist. The set of instructions for converting Verilog directly into a SPICE netlist includes a set of instructions for reading the second specification which includes parameters needed to produce the SPICE netlist. The first specification is designated as being located in least one comment field by the set of instructions for converting Verilog directly into a SPICE netlist. The second specification is placed in at least one comment field in the Verilog.

An article of manufacture includes a computer readable media having plurality of command records stored thereon. Each command record has a logic-simulation specification and a timing-simulation specification for causing a simulation system to execute a logic simulation that is controlled by the logic-simulation specification and a timing simulation that is controlled by the timing-simulation specification.

BRIEF DESCRIPTION OF THE DRAWINGS

The invention is pointed out with particularity in the appended claims. However, a more complete understanding of the present invention may be derived by referring to the detailed description when considered in connection with the figures wherein like reference numbers refer to similar items throughout the figures and:

FIG. 3 is a text listing in a Hardware Description Language specifying the NAND gate leaf cell of FIG. 2.

FIG. 6 is a SPICE netlist which results from conversion of a set of commands placed in Hardware Description Language using the conversion program described in the "MAN" page.

The description set out herein illustrates the various embodiments of the invention and such description is not intended to be construed as limiting in any manner.

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1:
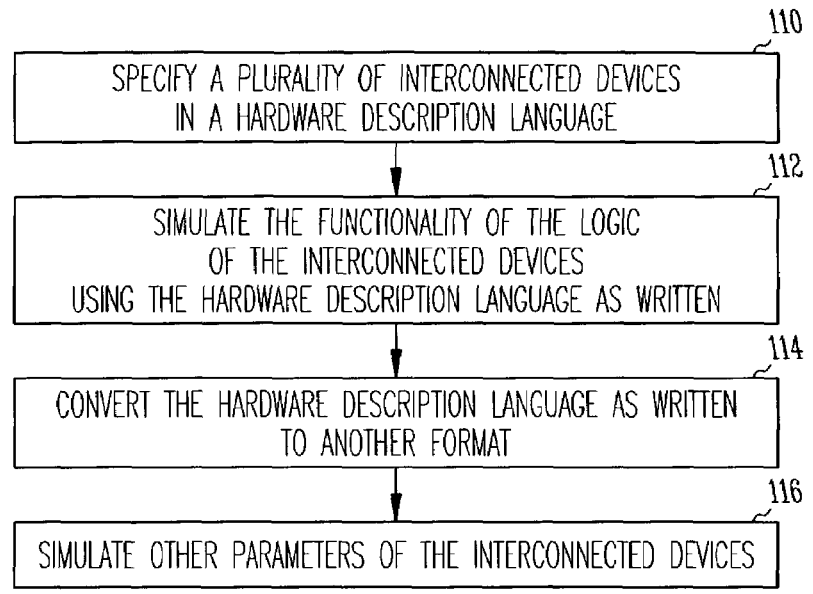
FIG. 1 a flow chart of the operations of a the simulation system of the present invention.

FIG. 1 is a flow chart of the operation 100 of a simulation system 700 (shown in FIG. 7) of the present invention. The overall operation of the simulation system 700 includes initially specifying a plurality of interconnected devices in a Hardware Description Language, as depicted by reference numeral 110. The Hardware Description Language used in one preferred embodiment is Verilog. The plurality of interconnected devices includes leaf cells. Leaf cells are a collection of transistors that represent a low-level function, such as a NAND gate, an AND gate, a MUX, and other, similar low-level functions. A syntax is developed in Verilog, which is able to describe the function of the leaf cell, and also uniquely describe the transistor connections within the leaf cell. In addition, Verilog also describes the connection between the plurality of leaf cells. When designing a circuit, various leaf cells having various functions can be interconnected. The Verilog syntax developed describes the function of the leaf cell, as well as the transistor usage and connections within the leaf cell and among the various leaf cells formed in the circuit. The initial step includes using a Verilog syntax that includes assigned statements, and extra comments within the syntax that can be used to infer the type of transistors, NMOS or PMOS. The details of specifying the various interconnected devices in the Hardware Description Language called Verilog will be discussed with respect to FIGS. 2 and 3 below.

The next step is to simulate the functionality of logic of the interconnected devices, using the Hardware Description Language as written, as depicted by reference numeral 112. The Verilog syntax developed is used to directly simulate the logic of the interconnected devices within the leaf cells, as well as between the leaf cells. The Hardware Description Language, as written, is converted into another format. The Verilog, which describes the interconnections between the transistors within leaf cells is then converted to transistor-level SPICE. SPICE stands for Simulation Program Integrated Circuits Especially, and is used to provide a detailed analysis of circuits containing active components, such as bipolar transistors, field effect transistors, diodes, and lump components such as resistors, capacitors, and inductors. SPICE is a circuit simulation program, and is not a logic simulation program, and therefore it is a different simulation from the simulation also run for functional logic, which uses the Verilog syntax as written. Conversion of the Hardware Description Language, or Verilog, as written to the SPICE format results in a SPICE netlist, that can be used to simulate the other parameters of the interconnected devices, as depicted by reference numeral 116 in FIG. 1.

Figure 2:
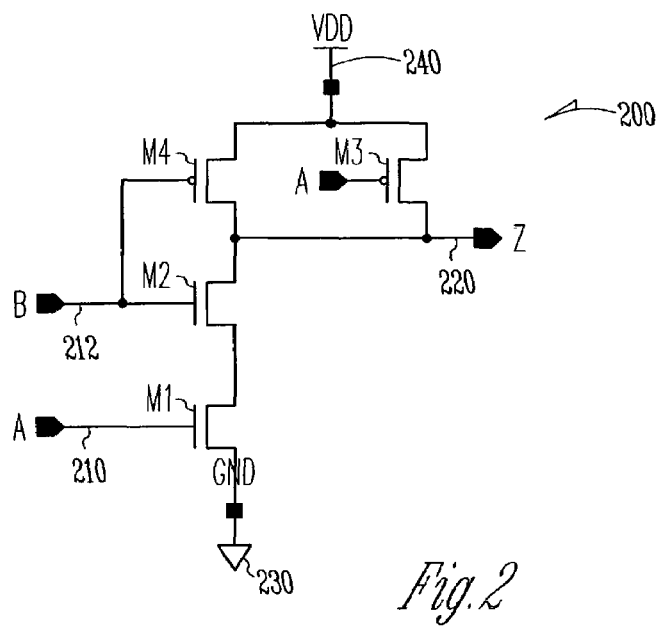
FIG. 2 is a schematic diagram of a NAND gate leaf cell.

FIG. 2 is a schematic diagram of a NAND gate leaf cell 200. The NAND gate leaf cell 200 includes an input A 210 and an input B 212, and also includes an output Z 220. The NAND gate 200 includes an NMOS transistor M1, an NMOS transistor M2, a PMOS transistor M3, and a PMOS transistor M4. The NMOS transistors M1, M2 have a source, a gate, and a drain. The drains of the Ml and M2 NMOS transistors are attached to ground 230. The source of the transistors M3 and M4 is attached to VDD 240. The NAND gate 200 is a logic unit or circuit that only does not produce an output when there is both an input from A and an input from B.

FIG. 3 is a text listing in a Hardware Description Language specifying the NAND gate leaf cell 200 of FIG. 2. The Hardware Description Language shown in FIG. 3 is Verilog. The hardware description language starts with a Verilog module statement 310. In the Verilog module statement there is a name of the leaf cell, followed by a parentheses, in which the ports z, a, and b are listed. In the next line, 312, the output port is defined as port Z. The next line, 314, defines the input ports as A and B. The next line, 316, is a wire statement, which shows the connectivity beyond the primary ports A, B, and Z. The wire statement defines the structure as int_Z. The next statement, 318, is an assign statement, which assigns the meaning to int_Z. The assign statement 318 describes the transistor (M1, M2, M3, M4) interconnects between the ports A, B, and Z, and the ground 230, and VDD 240. The assign statement describes the connection to the Z output, which, as shown in FIG. 2, is between ground 230 and VDD 220. Int_Z equals 1'b0 and A and B, or, as denoted by the vertical pipe, 1'b1 and the complement of A, and 1'b0 and the complement of B. 1'b0 indicates the low state, which is the ground connection 230. Zero is the low state, which is equal to the ground 230. So 1'b1 really shows a source connection onto M1 in the schematic shown in FIG. 2. The &~A means A is connected to the gate. The continuing function is that A and B create a temporary node, which is not defined, between the transistors M1 and M2, and connects the source and drains together. B, the first line of the assign statement, connects the gate to the B input 212. Therefore, the first line shows the path from the int_Z through the M2 transistor through the temporary node down through the M1 transistor down to the ground connection 230. The portion of the line begins with a vertical pipe, which is the same as an OR, which in turn implies that there is another connection to the int_Z net. The OR statement also implies that it's going to have two connections. One is a 1'b1 and not A, refers to the M3 PMOS transistor. The 1'b1 indicates a high signal (VDD 220) connected to the source of the M3 transistor. The &~A indicates a PMOS device, and A means the A net is fed directly into M3. Continuing on with the second line of the assign statement, the vertical pipe denotes an OR, so it denotes that the int_Z net has yet another connection. The connection is 1'b1 AND~B. This last portion of the statement refers to the PMOS transistor, labeled M4 in FIG. 2. And the 1'b1 indicates that the source is connected to high signal VDD. ~B means that it's PMOS, and that the B terminal connects to the gate. Using ampersand for an AND function, a vertical pipe for an OR function, and using a~for meaning the complement, each of the transistors of the leaf cell and the logic associated therewith can be denoted using Verilog language.

The next line is a tlv statement. The tlv statement carries a reference numeral 320. In front of the tlv statement are two forward slashes, which indicates to Verilog that this is a comment. The first tlv statement includes the letters abs int_Z. This tlv statement, or comment, 320, is an ordered list of the device sizes that are connected in the terminal int_Z. The order is set up to follow the definition set up in the assign statement 318. The first two go to the size of the connections to the A gate and B gate for the NMOS devices M1 and M2. The tlv statement, or comment, indicates that the A gate and B gate are each 5 microns and 5 microns, respectively. The next line also has two forward slashes, and is part of the tlv abs int_Z comment or statement. The next line of this particular comment 320 defines the size of the PMOS devices M3 and M4, as connected to the A and the B gates. Of course, any size can be placed in this ordered set. It should be noted that even fractional sizes may be used to denote the size of the devices in the tlv comment line 320. The actual size is critical to the second simulation. The absolute sizes are actually the width of the various gates for the various transistors M1, M2, M3, and M4. Next is an assign statement 322, which defines the actual output Z=int_Z. The next statement is another comment, tlv output Z, which carries the reference numeral 324. This particular comment is basically a shorthand notation to allow either an inverter or set of inverters to be built to give a certain output drive strength. The 6 is actually a ratio between P and an attached end device. Generally it's useful to have really high drive strength output, and through ratioed output, a series of inverters can be generated that drive up to that maximum output. In short, what's shown here in FIG. 3 is a simple example that shows that the basic logic function can be displayed or specified using an assign statement that instantiates the NMOS and PMOS devices, and then a syntax can be used to generate inverters to drive the output.

The inverter is just a stacked set of NMOS and PMOS devices which are connected. The default ratio is set between the NMOS and PMOS devices of the inverter. The statement basically defines the N-channel side, and then a default ratio calculates what the PMOS size is for the inverter. The output is assigned Z, and then the input to the inverter is int_Z. Therefore, the last statement shows how to build an output driver, or inverter that is used as an output driver.

The Hardware Description Language, or Verilog, shown in FIG. 3 can then be used with a Verilog simulator, such as VCS available from Synopsis of Mountainview, Calif. The Verilog simulator reads the Verilog language as written in FIG. 3. It should be noted that the comment fields, such as 320 and 324, are not read by the VCS simulator, and therefore these are disregarded for terms of running the Verilog simulation. Therefor, the Verilog simulator, such as VCS, is used to perform a simulation of the functional logic of the leaf cell, of the example NAND gate shown in FIG. 2 and specified in FIG. 3. It should be noted that each leaf cell can be similarly defined, and then the leaf cells can also be interconnected to produce a Verilog language which describes the internal connections of each leaf cell and the interconnection among leaf cells. This, too, can be input to the Verilog simulator, such as VCS, to do a logical function simulation on the circuit formed.

Figure 4:
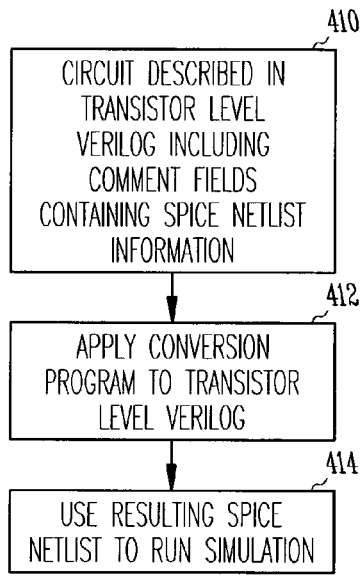
FIG. 4 is a flow chart of the conversion of a set of commands placed in a Hardware Description Language into another format for a second simulation.

The Verilog language as written in FIG. 3 can be converted from the HardwareDescription Language such as Verilog into another format for a second simulation. FIG. 4 shows the method. Initially, the circuit is described in transistor level Verilog, which includes comment fields containing comment information necessary for the second simulation, as depicted by reference numeral 412. The result of the conversion program is applied to the transistor level Verilog specification, such as the one shown in FIG. 3, as depicted by reference numeral 412. The result of the conversion is a SPICE netlist, which is used to run a second simulation, as depicted by reference numeral 414. The conversion program includes extracting information from the comment fields of the Verilog specification 320, 324 of FIG. 3, and using these to produce a file necessary to run the second simulation. In this particular embodiment of the invention, the second simulation is a SPICE simulation, which performs detailed analysis of circuits containing active components, such as bipolar transistors, field-effect transistors, diodes, and lump component such as resistors, capacitors, and inductors. SPICE considers the voltages and currents in a circuit to be a continuous quantities not quantatized into high and low values.

Figure 5:
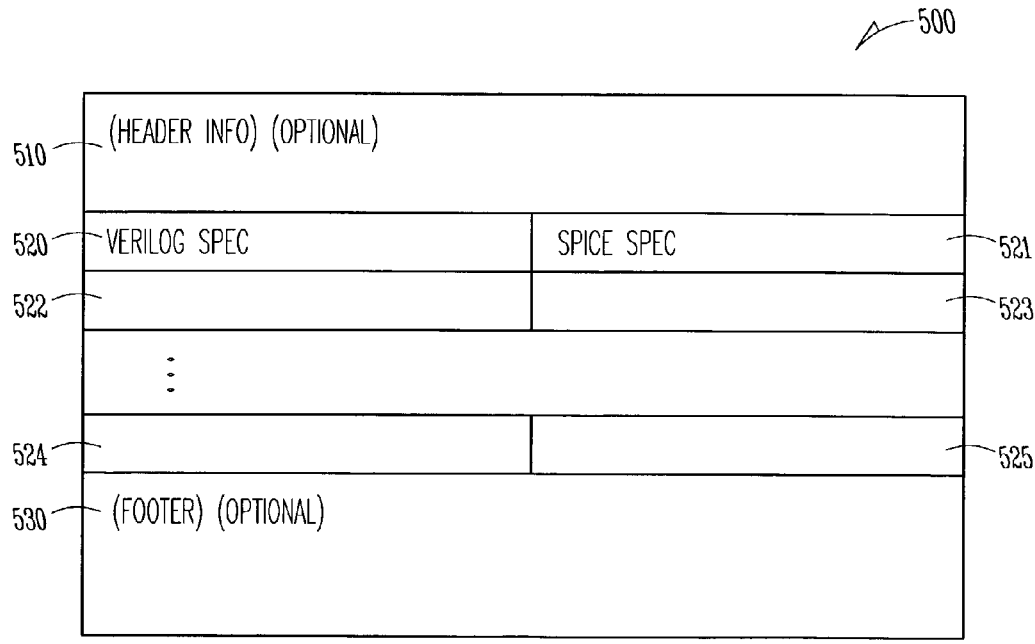
FIG. 5 shows a data set which is converted from the Hardware Description Language into a SPICE netlist for a second simulation.

FIG. 5 depicts a data set for data structure 500, which includes optional header information 510 and optional footer information 530. Between the header 510 and the footer 530 are a number of records of data 520, 522, 524, 521, 523 and 525. In actuality, there can be N records of data, as depicted by the three dots between data records 522 and 524. Each record includes a Verilog specification 520 and a SPICE specification 521. In other words, the data structure sets forth or specifies data necessary to run a Verilog simulation, such as records, which would be found in portions of the records 520, 522 and 524, and portions which are necessary to run a second simulation, or SPICE simulation. In other words, the records also include a SPICE specification portion 521, 523, 525. For the purposes of running a simulation which requires Verilog, the SPICE specification portions 521, 523, 525 are ignored. When running a second simulation, the Verilog portions 520, 522, 524 of the records are ignored. The second simulation may or may not require that the data structure 500 be converted. As described herein, the second simulation requires conversion of the text listing of the Hardware Description Language shown in FIG. 2 into a SPICE netlist. However, it is contemplated that a second simulation could be run on data which includes portions which are to be ignored by a program running the second simulation.

Shown below is a manual page that shows the translation of the transistor level Verilog, such as shown in FIG. 3, to a SPICE format or SPICE netlist. The details of this manual page are set forth in Table 1 below.

TABLE 1

This is the "MAN" page for a program that implements a translator of the Transistor Level Verilog to SPICE format:

```
tlv2TLS
NAME
    tlv2tls        Conversion of transistor level verilog to transistor
level spice
SYNOPSIS
    tlv2tls    [-8sf] [-1 listing_file] [-o spice_output_file]
               [-p parameters_file] [help] tlv_file0 tlv_file1 tlv_fileN
INPUT FILES
    [-8sf] flag - (optional: if set, TECH is set to 8sf   Default: 7s)
    transistor level verilog file(s)
    parameters file    (optional)
OUTPUT FILES
    listing file
    spice netlist output file
SEE ALSO
    Harro Zimmermann x66479, hmz@cray.com, (608) 783-1847
SUMMARY
                                        Revision Date
                                        Mar. 20, 1998
tlv2TLS (Transistor Level Verilog To Transistor Level Spice) is a
program that converts circuit level verilog modules to an equivalent
spice netlist.
FILE DESCRIPTIONS
parameters file
    This file contains numeric values and string constants that can
    make tlv2tls runtime computations variable without source editing
    and recompilation.
    At present time the following parameter file is used:
    /data/otter/sn2custom/app/tlv2tls/tlv2tls.parameters
    Parameters enclosed by quotes are string literals; otherwise they
    are floating point numbers. Numerical parameters may reference other
    numerical parameters that are defined earlier and include arithmetic
    expressions using * / + -. The expressions may be nested within
    parents.
```

TABLE 1-continued

This is the "MAN" page for a program that implements a translator of the Transistor Level Verilog to SPICE format:

```
    example of some parameter file entries:
    #define NFET      "nch"         /* spice pointer to NFET device models */
    #define PFET      "pch"         /* spice pointer to PFET device models */
    #define VCC       "vcc"
    #define CLK       "clk"
    #define VDD       "vdd"
    #define NFET_LEN              0.225
    #define NFET_WIDTH            0.99
    /* output inverter driver length, width and scaling parameters */
    #define INV_SCALE             1.333                  /* inverter scale factor */
    #define INV_NFET_LEN          NFET_LEN*INV_SCALE     /* inverter length */
    #define INV_NFET_WIDTH        NFET_WIDTH*(INV_SCALE+0.21) /* inverter width
*/
listing file
    The listing file simply contains the time and date when tlv2tls was
    run and any errors that were found in the tlv(s).
spice netlist output file
    The default output file is "spice_in". Use the -o spice_filename
    command line option to modify the name.
    The following spice netlist was generated from a tlv
    which ored two products. The lines beginning with **netprop
    and **pin are comments to spice but are commands to the mtv and
    mcc cad packages that identify the i/o pins to this module.
    *** tlv2tls version 1.22 run on Wed Mar 18 13:29:10 1998 by hmz
    .subckt and_or z z_b i1 i2 i3 i4
    ***
    ***      and_or spice netlist from tlv file: test
    ***
    ***      x = i1 & ~ i2 | i3 & i4 ;
    ***      z = x ;
    ***      z_b = ~ x ;
    ***
    **netprop z mtv_output
    **netprop z_b mtv_output
    **netprop i1 mtv_input
    **netprop i2 mtv_input
    **netprop i3 mtv_input
    **netprop i4 mtv_input
    ***
    **pin z property output
    **pin z_b property output
    **pin i1 property input
    **pin i2 property input
    **pin i3 property input
    **pin i4 property input
    ***
    ***
    m1 z i2 i1 vcc pch l=0.225u w=2.295u
    + ad=0.911212p as=0.911212p pd=5.375u ps=5.375u
    m2 z i4 i3 vss nch l=0.225u w=0.99u
    + ad=0.379425p as=0.379425p pd=2.715u ps=2.715u
    ***
    ***
    ***
    *** output inverter #1, 0.315
    m7 z_b z vss vss nch l=0.225u w=0.315u
    + ad=0.104362p as=0.104362p pd=1.365u ps=1.365u
    m8 z_b z vcc vcc pch l=0.225u w=0.72u
    + ad=0.2694p as=0.2694p pd=2.225u ps=2.225u
    ***
    .ends
transistor level verilog circuit file
    See the tlv DIRECTIVES section for specific info.
    Following is an example tlv having an "and/or" function:
    module and_or(z, z_b, i1, i2, i3, i4);
    output   z, z_b;
    input    i1, i2, i3, i4;
    wire     x;
    assign   x = i1 & ~ i2 | i3 & i4;
    assign   z = x;
    assign   z_b = ~x;
    endmodule
    In the above verilog notice the usage of the ~ character.
    The FETs that are output to the spice netlist are all NFETs
    except those that are implied (like the dynamic precharges, etc.)
    and those which are immediately preceded by a tilde. The FET
```

TABLE 1-continued

This is the "MAN" page for a program that implements a translator of the Transistor Level Verilog to SPICE format:

which ands i1 with i2 will be a PFET because of the tilde before the i2 term.
In the ~x case, there is only one term on the right of the equal sign and the assign statement defines a module output.
Here the ~x syntax will generate an inverter stage between signal x and module output z_b.
To aid other cad packages certain verilog comments may be placed in the tlv. Those comments will be gathered and placed in the spice netlist before the first FET device.

| | |
|---|---|
| Example mtv command in the tlv: | //mtv netprop out tristate |
| will appear in the spice netlist as: | **netprop out tristate |
| Example mcc command in the tlv: | //mcc one_hot s0 s1 s2 |
| will appear in the spice netlist as: | **mcc one_hot s0 s1 s2 | tlv DIRECTIVES
The tlv directives all are comments in the verilog syntax since they all begin with a double slash. Their intended use is to modify various characteristics in the spice netlist yet having it be logically equivalent with the circuit function described in the verilog. The currently available directives may be used to set an absolute width/length of a FET, control generation of dynamic circuits, and module output characteristics. A discussion of each directive follows.
ABS DIRECTIVE
DIRECTIVE FUNCTION
sets the width of an NFET or PFET transistor
controls whether source and/or drain area & perimeters will include contacts and the diffusion is shared
SYNTAX EXAMPLES
assign x = b & ~a | c & ~b | d & a & b;
//tlv abs x          16
//                    d
//                    8
//                    d
assign y =    a& b   & c   & d   & e   & f   & g   & h   & i   & j;
//tlv abs y       u1u   u2c   u3   c4u   c5c   c6   7u   8c   9
assign   int_z    = ~(t_b & a_b | t   & a);
//tlv abs int_z              4         4
USAGE GUIDELINES
The //tlv abs directive may be anywhere within the verilog module. It references an output name which is immediately after the abs keyword. Any number of continuation lines may follow provided that they have 2 slashes at the beginning of the line.
Each FET associated with a signal term in the assign statement may have a user defined width in the //tlv abs line. Or the width may he defaulted by using the letter d (or D) . In this case the width used is the value of the NFET_WIDTH or PFET_WIDTH parameter. The user may use any value greater than zero; however, the specified width will be adjusted to the nearest grid point of the physical polygon design grid.
Each width may be expressed as an integer, real number or the letter d (or D). Widths for FETs not having an explicit value will default to the appropriate parameter. However, entering more widths than FETs needed for the assign statement is reported as an error.
Commas may optionally be after a width.
Any number of spaces may be before or after the output name or between any of the widths. There is no trailing character needed. (like the ; for many other verilog lines)
Sharing of diffusions is specified with an optional letter code immediately prior to and/or following the width. Defaulting the width will imply that the diffusion is also to be defaulted. The diffusion codes are:

| | |
|---|---|
| <space> | unshared diffusion (default) |
| c | shared and contacted |
| u | shared and uncontacted |

The first diffusion code (found immediately prior the width) will be for the source diffusion area & perimeter. Immediately following the width is the drain diffusion code.
LEN DIRECTIVE
DIRECTIVE FUNCTION
sets the length of an NFET or PFET transistor
SYNTAX EXAMPLES
assign x = b & ~a | c & ~b | d & a & b;
//tlv len x           0.14
//                     d
//                    1.0
//                     d
assign y =    a& b   & c   & d   & e   & f   & g   & h   & i   & j;
//tlv len y       d     0.14   d     d     d     0.14   d     d     d TABLE 1-continued This is the "MAN" page for a program that implements a translator of the
Transistor Level Verilog to SPICE format:

USAGE GUIDELINES
The //tlv len directive may be anywhere within the verilog module. It
references an output name which is immediately after the len keyword. Any
number of continuation lines may follow provided that they have 2 slashes
at the beginning of the line.
Each FET associated with a signal term in the assign statement may have a
user defined length in the //tlv len line. Or the length may be defaulted
by using the letter d (or D) . In this case the length used is the value
of the NFET_LENGTH or PFET_LENGTH parameter. The user may use any value
greater than zero; however, the specified length will be adjusted to the
nearest grid point of the physical polygon design grid.
Each length may be expressed as an integer, real number or the letter d
(or D) . Lengths for FETs not having an explicit value will default to the
appropriate parameter. However, entering more lengths than FETs needed for
the assign statement is reported as an error.
Commas may optionally be after a length.
Any number of spaces may be before or after the output name or between any
of the lengths. There is no trailing character needed. (like the ; for
many other verilog lines)
DYNAMIC DIRECTIVES
DIRECTIVE FUNCTION
controls dynamic circuits outputted in the spice netlist
SYNTAX EXAMPLES
//tlv dynamic on
//tlv evaluate 8.3
//tlv dynamic off
USAGE GUIDELINES
The verilog statements in between the dynamic on and off will be converted
to NMOS and PMOS transistors connected in a dynamic circuit configuration.
In the dynamic mode, precharges will be connected to all drain nodes.
They will be PMOS having a width equal to parameter PFET_WIDTH.
(currently = 2.295) The precharge will be gated by either the verilog
term within the parents of the prior if( ) statement in the tlv or the
term set in the parameter CLK. (currently = "clk")
Dynamic output nets will also have keepers on them. A keeper is basically
an inverter which is driven from the dynamic node. It drives the gate of a
PFET whose source is tied to vcc, and whose drain is tied back to the
dynamic node. This inverter is a standard sized inverter.
In the following tlv:
//tlv dynamic on
assign      t      = clk & b;
assign      t_b    = clk & b_b;
assign      int_z_b = ~(t_b & a | t & a_b);
Parameter CLK actually controls the term name that is to be used as the
connection point for the evaluate transistor. (currently = "clk")
Because "clk" is used in 2 of the assign statements, both t and t_b will
be recognized as the evaluate connection point for the dynamic logic
block whose output is int_z_b. Since there is no //tlv evaluate
directive, the evaluate transistor's size is equal to the sum of all of
the transistors which are directly connected to it. Use of the //tlv
evaluate directive can specify explicitly what this width is.
If no evaluate transistor is desired (1'b1 in the assign statements
instead of clk) then the bottom of the dynamic stack gets tied to VSS.
OUTPUT DIRECTIVE
DIRECTIVE FUNCTION
sets the output drive profile for one or a complementary pair of outputs
SYNTAX EXAMPLES
output z, z_b;
output x, x_b;
output y;
assign        z     = int_z;
assign        z_b   = ~int_z;
//tlv output  z         5 level 2
//tlv output  z_b       5 level 3
assign        x     = int_x;
assign        x_b   = ~int_x;
//tlv output x,x_b 8 level 4
assign     y     = ~int_y;
//tlv output y        7
USAGE GUIDELINES
The //tlv output directive may be anywhere within the verilog module. It
references one or a complementary pair of module output names which are
immediately after the output keyword. Optionally the output keyword may
be outputs.
The basic syntax is: //tlv output output_term NMOS_size <levels #>
The level (or levels) keyword may be defaulted.

TABLE 1-continued

This is the "MAN" page for a program that implements a translator of the Transistor Level Verilog to SPICE format:

In one example above, module output y will be output from 1 inverter level since the verilog dictates that the signal is made from the complement of int_y. The width of the NFET device in the inverter will be 7.
Module output z will be from 2 cascaded inverters with the NFET in the final inverter stage having a width of 5. Module output z_b will also have a final NFET width of 5 but will be output from 3 cascaded inverter levels. The width of the NFET device in all preceding inverter levels will smaller than the following inverter's NFET width by the value of parameter INV_FACTOR. (currently = 3.6) However, the NFET width will go no lower than the minimum width specified by parameter INV_NFET_WIDTH. (currently = 0.315) The size of the PFET device in each inverter stage will be the value of parameter INV_N2P_WIDTH times the width of the NFET device. (currently = 2.3)
If in the verilog, the module output term is made directly from the intermediate signal then an even number of levels must be specified in the directive. Should the verilog dictate that the module output term is made from the complement of the intermediate signal then an odd number of levels must be in the directive. In the above example, z_b is made from the complement of int_z and therefore an odd number of levels must be specified.
The syntax for complementary pairs is: //tlv output output_term,output_term_b NMOS_size levels #
In this case the levels keyword must be present and at least 2 levels be declared. Either the true or complement output may be listed first as long as the correct (odd or even) number of inverter levels are indicated. The module outputs may be latched. The interconnection will be as follows
(intermediate signal) ----> nth ----> 3rd ----> 2nd ----> 1st ---->
(1st output listed)
                            inverter     inverter  |  inverter  inverter
                                                    |
                                                    |
                                                  |--> 1st_b ----> (2nd
output listed)
                                                          inverter
Where the size of the NFET devices in each inverter is as follows:
1st, 1st_b         W1=directive width
2nd               W2=W1/INV_FACTOR
3rd               W3=W2*(INV_FACTOR + 1)/INV_FACTOR
nth               W(n)=W(n−1)/INV_FACTOR
The size of the PFET device in each inverter stage will be the value of parameter INV_N2P_WIDTH times the width of the NFET device. (currently =2.3)
All widths will then be adjusted to the nearest grid point of the physical polygon design grid.
DRV_HI DIRECTIVE
DIRECTIVE FUNCTION
sets output drive profile
SYNTAX EXAMPLE
output z;
assign       z    =~int_q;
//tlv drv_hi   z    5 levels 3
USAGE GUIDELINES
The //tlv drv_hi directive may be anywhere within the verilog module. It references a module output name which is immediately after the drv_hi keyword.
In the above example, when a drv_hi output is specified with levels of 3 the output will look like:
(signal int_q) ------> drv_hi ----> drv_lo -----> drv_hi ----> (output z)
                         inverter        inverter       inverter
The output size (5, in the example) specified for a drv_hi macro represents the final drv_hi stage's Wp, not Wn as is the case for standard outputs.
drv_hi inverting stages are characterized by Wp/Wn ratios given by the parameter DRV_HI_P2N_RATIO.     (currently = 10.0)
drv_lo inverting stages are characterized by Wn/Wp ratios given by the parameter DRV_LO_N2P_RATIO.     (currently = 2.0)
Successive scaling of stage-to-stage inverter sizes is controlled in the following manner:
  a) A drv_hi inverter's Wp shall be larger than its preceding drv_lo Wn
      by the value of parameter HI_P_2_LO_N.   (currently = 12.0)
  b) A drv_lo inverter's Wn shall be larger than its preceding drv_hi Wp
      by the value of parameter LO_N_2_HI_P.   (currently = 5.0)
All widths will then be adjusted to the nearest grid point of the physical polygon design grid.
If in the verilog, the drv_hi module output is made directly from the intermediate signal then an even number of levels must be in the

TABLE 1-continued

This is the "MAN" page for a program that implements a translator of the
Transistor Level Verilog to SPICE format:

directive. Should the verilog dictate that the drv_hi module output is
made from the complement of the intermediate signal then an odd number
levels must be in the directive. In the above example, z is made from the
complement of int_q and therefore an odd number of levels must be
specified.

FIG. 6 is a SPICE netlist which results from conversion of a set of commands placed in Hardware Description Language using the conversion program described in the "MAN" page. The SPICE netlist is used to perform the SPICE simulation. The SPICE simulation provides a detailed analysis of the circuits containing active components, as mentioned previously.

Figure 7:
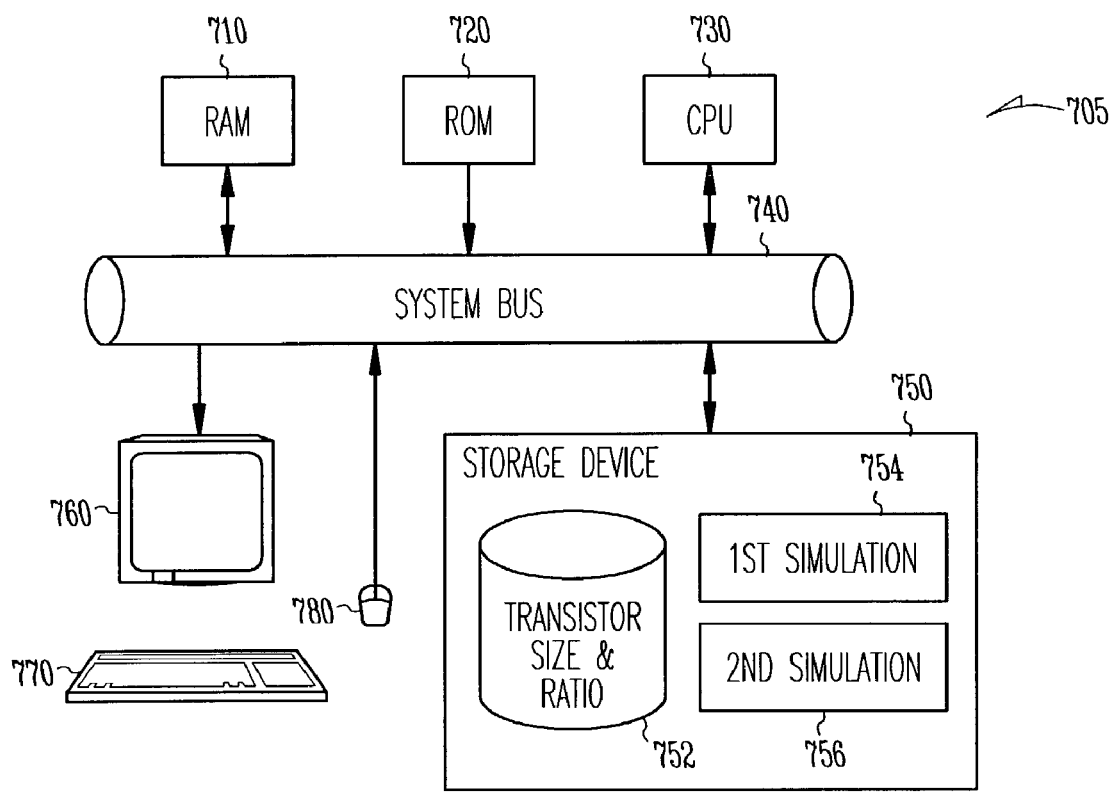
FIG. 7 is a block diagram of the electronic device simulation system consistent with the present invention.

FIG. 7 is a block diagram of the electronic device simulation system consistent with the present invention. A computer simulation system 700 is shown in FIG. 7. Systems consistent with the present invention may be implemented using a conventional personal computer, such as an IBM compatible personal computer. FIG. 7 shows the computer system 700 and the architecture 705 of one such computer 700 for executing a first simulation program and a second simulation program as part of a simulation system. As shown, architecture 705 uses system bus 740 to connect RAM 710, ROM 720, CPU 730, storage device 750, monitor 760, keyboard 770, and mouse 780. These are all standard components of a personal computer. For example, CPU 730 may be a microprocessor manufactured by Intel Corp. or manufactured by Advanced Micro Devices or the like. Likewise, the other components are generally standard on most personal computers or workstations, with one exception, the storage device 750. The storage device 750 includes three components. The components include transistor size and ratio, database 752, first simulation program (Verilog/VCS) 754, and a second simulation program such as a SPICE simulation.

Database 752 includes a variety of information, including rules related to the size of the transistor device for a given placement in a comment field such as 318, and for the given placement within the comment field. The rules of database 352 are typically criteria used in determining size for the second simulation. Database 352 also includes information on, for example, the default values and ratios needed for building inverters for a given leaf cell, such as shown and specified in FIGS. 2 and 3.

Advantageously, the transistor level verilog specification such as shown in FIG. 3 can be run directly without conversion to perform a functional logic test. Yet another advantage is that circuits can be designed without the need to use graphical data or a graphics package. The circuit design can be done using a text design tool. A further advantage of this is that the formed circuit can be stored as text rather than as graphical data. The textual data requires less storage than corresponding graphical data necessary to fully describe the circuit. Still a further advantage is that the text data of the circuit can be used to verify the circuit after it has been manufactured or built.

Conclusion

In conclusion, a method includes inputting a plurality of command having a syntax language wherein each command includes a first specification and a second specification. The method also includes execution a logic simulation controlled by the first specification and ignoring the second specification in the logic simulation. The method also includes executing a timing simulation controlled by the second specification and ignoring the first specification in the timing simulation. In some embodiments, executing a logic simulation controlled by a first simulation and ignoring the second specification includes designating the second specification as a comment field to the logic simulation. Executing a timing simulation controlled by the second specification and ignoring the second specification includes designating the first specification as a comment field to the timing simulation. Executing the logic simulation further comprises executing a file using a hardware description language. In some embodiments, the hardware description language for executing the logic simulation is Verilog. In some embodiments, the timing simulation is executed using a file in SPICE format. In some embodiments, executing the timing simulation includes converting a file in Verilog to a file in SPICE format. More generally, executing the timing simulation further includes converting the logic simulation file format to a timing simulation file format.

An article of manufacture includes a computer readable media having instructions thereon. The instructions cause a suitably programmed system to execute a method that includes inputting a plurality of commands having a syntax language wherein each command includes a first specification and a second specification. The method also includes executing a logic simulation controlled by the first specification and ignoring the second specification in the logic simulation. The method also includes executing a timing simulation controlled by the second specification and ignoring the first specification in the timing simulation.

A data structure includes a plurality of command records each following a language syntax wherein each one of the plurality of command records includes a first specification and a second specification. The first specification provides information to be executed by a logic simulator and ignored by a timing simulator. The second specification provides information to be executed by a timing simulator and ignored by a logic simulator.

An article of manufacture includes a computer readable media having a data structure for causing a suitably programmed system to execute a logic simulation that is controlled by the first specification and a timing simulation that is controlled by the second specification. The data structure of the article of manufacture includes a plurality of command records each following a language syntax wherein each one of the plurality of command records includes a first specification and a second specification. The first specification provides information to be executed by a logic simulator and ignored by a timing simulator. The second specification provides information to be executed by a timing simulator and ignored by a logic simulator. In some embodiments,, the article of manufacture the data structure causes a suitably programmed system to execute a Verilog simulation that is controlled by the first specification and a SPICE simulation that is controlled by the second specification.

A simulation system includes storage that holds a plurality of commands having a syntax language wherein each command includes a first specification and a second specification. The simulation system also includes a logic simulator that is controlled by the first specification and that ignores the second specification. The simulation system also includes a timing simulator that is controlled by the second specification and that ignores the first specification. In some embodiments of the simulation system, the plurality of commands are written in Verilog. In some embodiments, the timing simulation includes a set of instructions for converting Verilog directly into a SPICE netlist. The set of instructions for converting Verilog directly into a SPICE netlist includes a set of instructions for reading the second specification which includes parameters needed to produce the SPICE netlist. The first specification is designated as being located in least one comment field by the set of instructions for converting Verilog directly into a SPICE netlist. The second specification is placed in at least one comment field in the Verilog.

An article of manufacture includes a computer readable media having plurality of command records stored thereon. Each command record has a logic-simulation specification and a timing-simulation specification for causing a simulation system to execute a logic simulation that is controlled by the logic-simulation specification and a timing simulation that is controlled by the timing-simulation specification.

A simulation system includes storage that holds a plurality of command records having a syntax language wherein each command record includes a first specification and a second specification. The simulation system includes logic simulation apparatus that is controlled by the first specification and that ignores the second specification. The simulation system also includes a timing simulation apparatus that is controlled by the second specification and that ignores the first specification.

A method includes specifying a first set of interconnected devices associated with a first leaf cell in Verilog syntax, and specifying a second set of interconnected devices associated with a second leaf cell in Verlilog syntax. A connection between the first leaf cell and the second leaf cell is also specified in Verilog syntax. This specifies a circuit. The functionality of the logic can be tested by running a logic simulation on the circuit without converting to Verilog syntax. The Verilog syntax, associated with the circuit, can be converted directly from Verilog syntax to a SPICE netlist. The SPICE netlist can be used to simulate the timing and other parameters of the circuit. The Verilog syntax can be used to verify that the circuit as built. Specifying the first set of interconnected devices associated with the first leaf cell further includes specifying parameters needed for the SPICE netlist as a comment in the Verilog syntax. In addition, specifying the second set of interconnected devices associated with the second leaf cell also includes specifying parameters needed for the SPICE netlist as a comment in the Verilog syntax.

A computer readable medium includes an instruction set for causing a suitably programmed computer system to execute the method set forth in the previous paragraph. In addition, a data structure includes a first portion which controls portion of the Verilog simulation and is ignored by the SPICE simulation, and includes a second portion which controls the SPICE simulation and is ignored by the Verilog simulation.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method comprising:
inputting a unitary set of commands, wherein the set includes a first specification for a device and a second specification for the device that are selectively invoked;
executing a logic simulation for the device that is controlled by the first specification while ignoring the second specification until the logic simulation is completed; and
executing an analog simulation for the device that is controlled by the second specification while ignoring the first specification until the analog simulation is completed, wherein executing the logic simulation and the analog simulation generate respective logical and analog parameters for assessing the performance of the device; and
displaying at least one of the generated logical and analog parameters on a display device.

2. The method of claim 1, wherein executing a logic simulation for the device that is controlled by a first specification while ignoring the second specification includes designating the second specification as a comment field to the logic simulation.

3. The method of claim 1, wherein executing an analog simulation for the device that is controlled by the second specification while ignoring the first specification includes designating the first specification as a comment field to the analog simulation.

4. The method of claim 1, wherein executing the logic simulation further comprises executing a file using a hardware description language.

5. The method of claim 1, wherein executing the logic simulation further comprises executing a file using Verilog.

6. The method of claim 5, wherein executing the analog simulation further comprises executing a file in SPICE format.

7. The method of claim 6, wherein executing the analog simulation further comprises converting a file in Verilog to a file in SPICE format.

8. The method of claim 1, wherein executing the analog simulation further comprises converting a logic simulation file format to an analog simulation file format.

9. An article of manufacture comprising a computer readable media having the method of claim 1 encoded as executable instructions and recorded thereon which when executed cause a processor to execute the method of claim 1.

10. A method of performance simulation for an electronic device, comprising:
compiling a unitary set of commands, wherein the set includes a logical specification for the device and an analog specification for the device;
selecting the logical specification from the unitary set to perform a logic simulation for the device while the analog specification is not processed;

generating at least one logical parameter from the logical specification;

selecting the analog specification from the unitary set to perform an analog simulation for the device while the logical specification is not processed;

generating at least one analog parameter from the analog specification, wherein the at least one logical parameter and the at least one analog parameter are operable to simulate the performance of the device; and displaying a selected one of the at least one logic parameter and the at least one analog parameter on a display device.

11. The method of claim 10, wherein compiling a set of commands further comprises generating a data structure having a first set of records describing the logical specification, and a second set of records describing the analog specification.

12. The method of 11, wherein the first set of records further comprises Verilog commands, and the second set of records comprises SPICE commands.

13. The method of claim 10, wherein selecting the logical specification further comprises generating at least one logical output value for the simulated device, and further wherein selecting the analog specification further comprises generating at least one of a voltage value and a current value.

14. The method of claim 10, wherein compiling a set of commands further comprises extracting commands having a delimiter positioned prior to the commands only directed to the analog specification of the device.

15. The method of claim 10, wherein compiling a set of commands further comprises positioning a delimiter prior to commands only directed to the analog specification of the device.

16. A method of performance simulation for an electronic device, comprising:

compiling a unitary set of commands, wherein the set includes a logical specification for the device expressed in a first format and an analog specification for the device expressed in a second format;

selectively executing the logical specification in the first format while not executing the analog specification expressed in the second format to generate at least one logical parameter for the device;

selectively executing the analog specification in the second format while not executing the logical specification expressed in the first format to generate at least one parameter for the device other than the at least one logical parameter, wherein the at least one logical parameter and the at least one other parameter are operable to non-synchronously simulate the performance of the device; and displaying a selected one of the logic parameter and the other parameter of the device other than the logic parameter on a display device.

17. The method of claim 16, wherein compiling a set of commands further comprises generating a data structure having a first set of records describing the logical specification, and a second set of records describing the analog specification.

18. The method of claim 17, wherein the first set of records further comprises records expressed in a Verilog format, and the second set of records comprises records expressed in a SPICE format.

19. The method of claim 16, wherein selectively executing the logical specification in the first format further comprises generating at least one logical output value for the simulated device, and further wherein selectively executing the analog specification in the second format further comprises generating at least one of a voltage value and a current value.

20. The method of claim 16, wherein compiling a set of commands further comprises extracting commands having a delimiter positioned prior to commands only directed to the analog specification expressed in the second format.

21. The method of claim 16, wherein compiling a set of commands further comprises positioning a delimiter prior to commands only directed to the analog specification of the device expressed in the second format.

* * * * *

UNITED STATES PATENT AND TRADEMARK OFFICE
CERTIFICATE OF CORRECTION

| | | |
|---|---|---|
| PATENT NO. | : 7,587,305 B2 | Page 1 of 2 |
| APPLICATION NO. | : 10/180265 | |
| DATED | : September 8, 2009 | |
| INVENTOR(S) | : Lutz et al. | |

It is certified that error appears in the above-identified patent and that said Letters Patent is hereby corrected as shown below:

In column 2, line 34, delete "Method" and insert -- A method --, therefor.

In column 4, line 21, delete "figures" and insert -- figures, --, therefor.

In column 5, line 38, delete "Ml" and insert -- M1 --, therefor.

In column 6, line 53, delete "output," and insert -- outputs, --, therefor.

In column 6, line 62, delete "The" and insert -- This --, therefor.

In column 7, line 3, delete "Mountainview," and insert -- Mountain View, --, therefor.

In column 7, line 14, delete "interconnection" and insert -- interconnections --, therefor.

In column 7, line 18, delete "HardwareDescription" and insert -- Hardware Description --, therefor.

In column 7, lines 23-26, delete "412. The result of the conversion program is applied to the transistor level Verilog specification, such as the one shown in FIG. 3, as depicted by reference numeral 412." and insert -- 410. A conversion program is applied to the transistor level Verilog specification, such as the one shown in FIG. 3, as depicted by reference numeral 412. --, therefor.

In column 8, line 2, delete "component" and insert -- components --, therefor.

In column 8, line 5, delete "quantatized" and insert -- quantized --, therefor.

In column 17, line 66, delete "command" and insert -- commands --, therefor.

In column 18, line 12, delete "execution" and insert -- executing --, therefor.

In column 18, line 66, delete "embodiments,," and insert -- embodiments, --, therefor.

In column 19, line 42, delete "Verlilog" and insert -- Verilog --, therefor.

UNITED STATES PATENT AND TRADEMARK OFFICE
CERTIFICATE OF CORRECTION

PATENT NO. : 7,587,305 B2
APPLICATION NO. : 10/180265
DATED : September 8, 2009
INVENTOR(S) : Lutz et al.

It is certified that error appears in the above-identified patent and that said Letters Patent is hereby corrected as shown below:

In column 21, line 18, in Claim 12, delete "11," and insert -- Claim 11, --, therefor.

Signed and Sealed this

Twenty-second Day of December, 2009

David J. Kappos
*Director of the United States Patent and Trademark Office*

UNITED STATES PATENT AND TRADEMARK OFFICE
CERTIFICATE OF CORRECTION

PATENT NO. : 7,587,305 B2
APPLICATION NO. : 10/180265
DATED : September 8, 2009
INVENTOR(S) : Lutz et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 866 days.

Signed and Sealed this

Twenty-first Day of September, 2010

David J. Kappos
*Director of the United States Patent and Trademark Office*